(12) United States Patent
Watari et al.

(10) Patent No.: US 8,564,109 B2
(45) Date of Patent: Oct. 22, 2013

(54) ILLUMINATION APPARATUS

(75) Inventors: Gen Watari, Fukuoka-ken (JP); Kazuhiro Inoue, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 62 days.

(21) Appl. No.: 13/233,340

(22) Filed: Sep. 15, 2011

(65) Prior Publication Data

US 2012/0126266 A1    May 24, 2012

(30) Foreign Application Priority Data

Nov. 24, 2010  (JP) ................................. 2010-260928

(51) Int. Cl.
*H01L 23/495*  (2006.01)

(52) U.S. Cl.
USPC .............. 257/676; 257/E33.066; 362/249.02; 362/249.03

(58) Field of Classification Search
USPC .......................... 362/249.01, 249.02, 249.03; 257/98–100, 81, 676, E33.066
See application file for complete search history.

(56) References Cited

U.S. PATENT DOCUMENTS

| | | | | |
|---|---|---|---|---|
| 5,172,214 A | * | 12/1992 | Casto | 257/676 |
| 6,501,156 B1 | * | 12/2002 | Nakanishi et al. | 257/666 |
| 2003/0094621 A1 | * | 5/2003 | Teramae et al. | 257/99 |
| 2003/0137828 A1 | * | 7/2003 | Ter-Hovhannisian | 362/92 |
| 2006/0240599 A1 | * | 10/2006 | Amano et al. | 438/123 |
| 2007/0108436 A1 | * | 5/2007 | Sanmyo | 257/13 |
| 2009/0237627 A1 | * | 9/2009 | Kobori et al. | 353/98 |
| 2010/0163920 A1 | | 7/2010 | Itai | |
| 2011/0149597 A1 | * | 6/2011 | Jao et al. | 362/607 |
| 2011/0186868 A1 | | 8/2011 | Watari et al. | |
| 2011/0186901 A1 | | 8/2011 | Ushiyama et al. | |
| 2011/0193112 A1 | | 8/2011 | Inoue et al. | |
| 2012/0080674 A1 | | 4/2012 | Shimizu et al. | |

FOREIGN PATENT DOCUMENTS

JP    2004-274027    9/2004

* cited by examiner

*Primary Examiner* — Matthew W Such
*Assistant Examiner* — Ali Naraghi
(74) *Attorney, Agent, or Firm* — White & Case LLP

(57) ABSTRACT

According to one embodiment, an illumination apparatus includes an LED (Light Emitting Diode) module, a light guide plate, and a support body. The support body supports the LED module and the light guide plate. A reflective surface of the support body is provided between a portion supporting the LED module and a portion supporting the light guide plate. The reflective surface is reflective with respect to the light emitted from the LED package. The LED module is tilted relative to the reflective surface with the LED package mounting surface being toward the reflective surface. An angle between the LED module and the reflective surface is less than 90°.

16 Claims, 14 Drawing Sheets

ILLUMINATION APPARATUS

CROSS-REFERENCE TO RELATED APPLICATION

This application is based upon and claims the benefit of priority from Japanese Patent Application No. 2010-260928, filed on Nov. 24, 2010; the entire contents of which are incorporated herein by reference.

FIELD

Embodiments described herein relate generally to an illumination apparatus.

BACKGROUND

In recent years, the range of applications of LED packages in which LED chips are mounted, e.g., backlights of liquid crystal display apparatuses, illumination, etc., has been increasing. It follows that higher durability and lower costs of the LED packages and higher utilization efficiency of light emitted from the LED packages are needed.

DETAILED DESCRIPTION

Figure 1A:
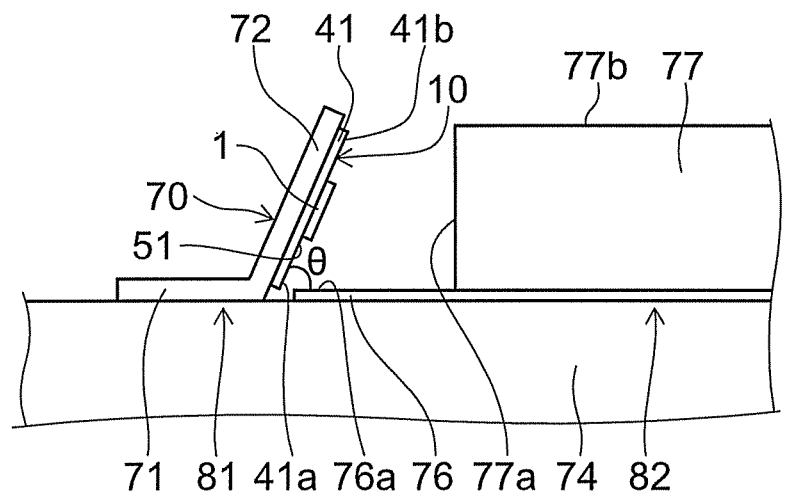
FIGS. 1A and 1B are schematic side views of an illumination apparatus of an embodiment.

According to one embodiment, an illumination apparatus includes an LED (Light Emitting Diode) module, a light guide plate, and a support body. The LED module includes a substrate, an interconnect layer provided on the substrate, and an LED package mounted on the interconnect layer. The light guide plate is provided on an LED package mounting surface side of the LED module. The light guide plate is transmissive with respect to light emitted from the LED package. The support body supports the LED module and the light guide plate. A reflective surface of the support body is provided between a portion supporting the LED module and a portion supporting the light guide plate. The reflective surface is reflective with respect to the light emitted from the LED package. The LED module is tilted relative to the reflective surface with the LED package mounting surface being toward the reflective surface. An angle between the LED module and the reflective surface is less than 90°.

Embodiments will now be described with reference to the drawings. Similar components in the drawings are marked with like reference numerals.

FIG. 1A is a schematic side view of an illumination apparatus of the embodiment.

The illumination apparatus of the embodiment may be used as, for example, the backlight of a liquid crystal display apparatus. The backlight is disposed on the backside (the side opposite to the display screen) of the liquid crystal panel. In FIG. 1A, a not-illustrated liquid crystal panel is disposed above a light guide plate 77.

The illumination apparatus of the embodiment includes a light bar 10 as an LED module. The light bar 10 has a structure in which multiple light emitting diode (LED) packages 1 are mounted on a substrate 41.

The light guide plate 77 is transmissive with respect to light emitted from the LED package 1 and is made of, for example, a resin material such as acryl, etc. The light guide plate 77 includes a light incident surface 77a facing the LED package 1 mounting surface side of the light bar 10 and a light emergence surface 77b opposing the liquid crystal panel.

The light guide plate 77 is supported by a support body 74 such as a housing, etc. A reflective sheet 76 that is reflective with respect to the light emitted from the LED package 1 is provided on the support body 74; and the light guide plate 77 is supported on the reflective sheet 76. In other words, the reflective sheet 76 is provided on the side of the surface of the light guide plate 77 opposite to the light emergence surface 77b.

The light bar 10 is held by a holder 70. The holder 70 includes a substrate holding portion 72 that protrudes above the support body 74 in FIG. 1A. The light bar 10 is held at the surface of the substrate holding portion 72 on the light incident surface 77a side of the light guide plate 77. For example, the substrate 41 of the light bar 10 is fastened with screws or bonded to the substrate holding portion 72.

A mounting portion 71 is provided at the lower end portion of the substrate holding portion 72 to extend toward the side in the direction opposite to the position where the light guide plate 77 is provided. For example, the mounting portion 71 is fastened with screws or bonded to the support body 74. Thereby, the holder 70 is fixed with respect to the support body 74.

The reflective sheet 76 is provided between a portion 81 of the support body 74 that supports the light bar 10 and a portion 82 of the support body 74 that supports the light guide plate 77. In other words, a reflective surface 76a, which is reflective with respect to the light emitted from the LED package 1, is adjacent to a space where the light bar 10 faces the light incident surface 77a of the light guide plate 77.

The light bar 10 is tilted relative to the reflective surface 76a with the LED package 1 mounting surface being toward the reflective surface 76a. The front surface of the light bar 10 (the front surface of the substrate 41 or the front surface of the LED package 1) is neither parallel nor perpendicular but is tilted with respect to the reflective surface 76a. In other words, an angle θ between the light bar 10 and the reflective surface 76a is less than 90°. The front surface of the light bar 10 is neither parallel nor perpendicular but is tilted with respect to the light incident surface 77a of the light guide plate 77.

The light bar 10 will now be described.

Figure 3:
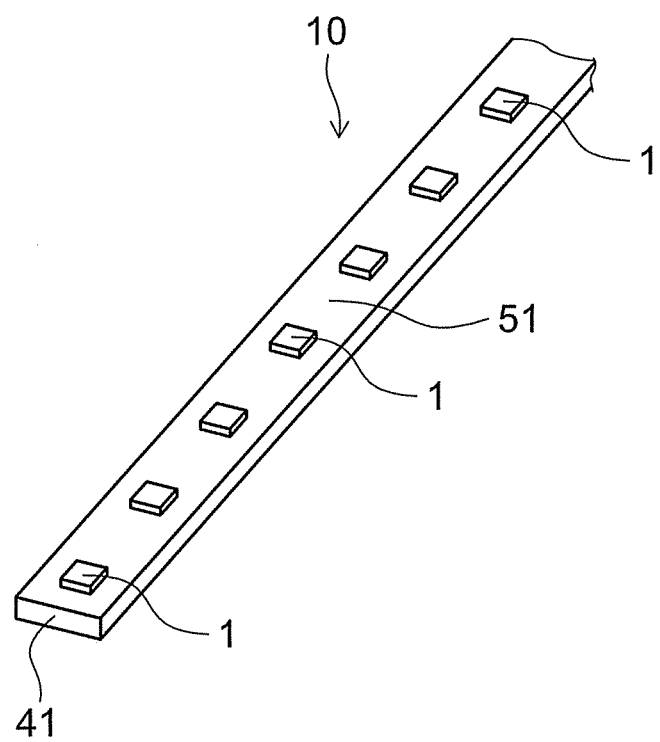
FIG. 3 is a perspective view of a light bar of the embodiment.

FIG. 3 is a perspective view of the light bar 10.

The light bar 10 has a structure in which the multiple LED packages 1 are mounted on the substrate 41. The substrate 41 is formed in a rectangular plate configuration; and the multiple LED packages 1 are arranged in the longitudinal direction thereof. The longitudinal direction of the substrate 41 is the direction piercing the page surface in FIG. 1A. The light incident surface 77a of the light guide plate 77 and the reflective surface 76a also extend along the longitudinal direction.

The multiple LED packages 1 may be arranged in multiple columns along the longitudinal direction of the substrate 41. Alternatively, the LED module is not limited to a light bar and may have multiple LED packages included in a planar light source by being arranged two-dimensionally on the substrate.

Figure 4A:
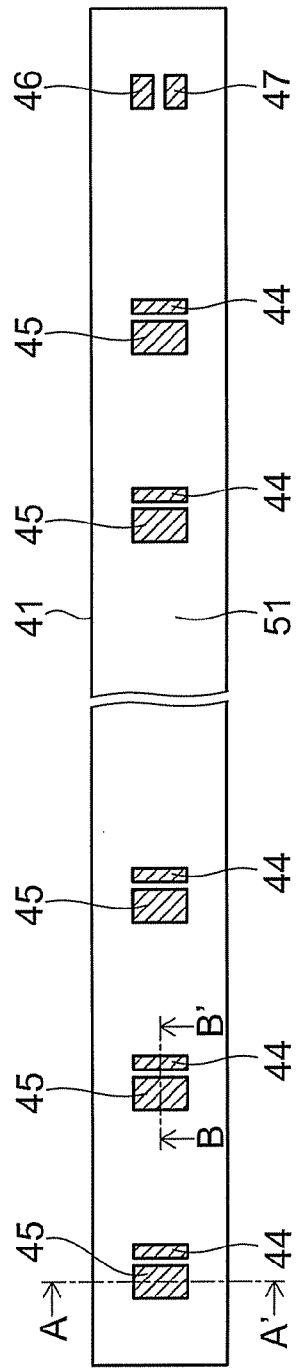
FIGS. 4A and 4B are plan views illustrating an interconnect layer of the light bar.
Figure 4B:
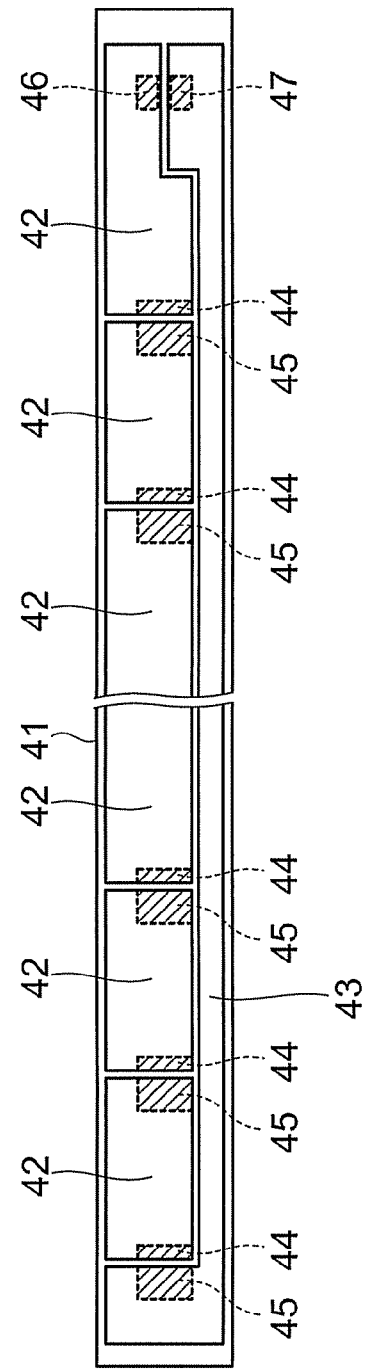

FIG. 4A is a plan view of the state in which the LED packages 1 are not mounted to the light bar 10. FIG. 4B is a plan view of the state in which a reflector (e.g., a white resist) 51 of FIG. 4A is removed.

Figure 5A:
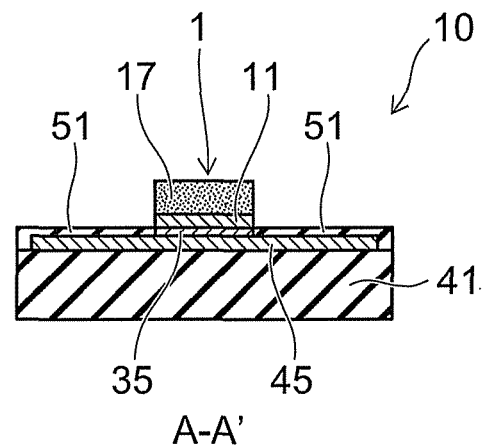
FIG. 5A is a cross-sectional view corresponding to the A-A' cross section of FIG. 4A.
Figure 5B:
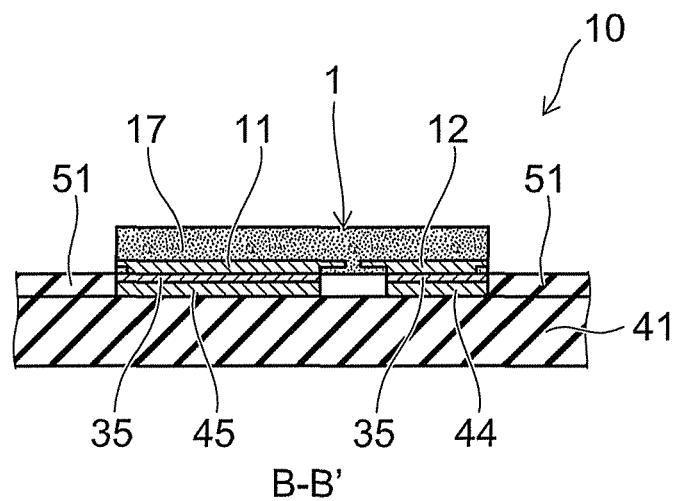
FIG. 5B is a cross-sectional view corresponding to the B-B' cross section of FIG. 4A.

FIG. 5A is a cross-sectional view corresponding to the A-A' cross section of FIG. 4A; and FIG. 5B is a cross-sectional view corresponding to the B-B' cross section of FIG. 4A. Namely, FIG. 5A illustrates a cross section cut along the width direction (the short-side direction) of the light bar 10; and FIG. 5B illustrates a cross section cut along the longitudinal direction of the light bar 10.

Figure 6:
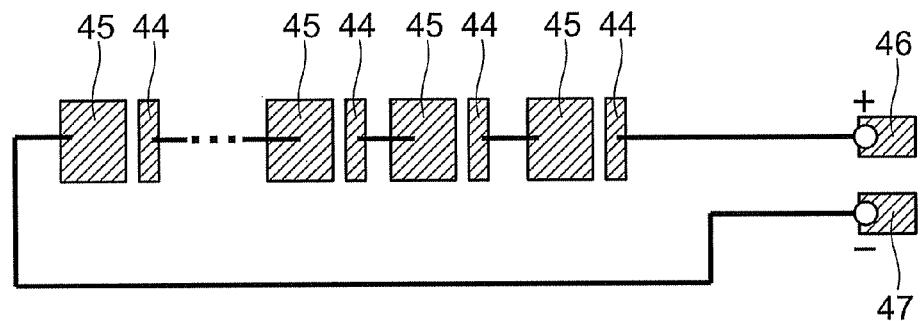
FIG. 6 is a circuit diagram of the interconnect layer illustrating in FIGS. 4A and 4B.

FIG. 6 illustrates the electrical connection relationship between interconnect layers 44 and 45 and connectors 46 and 47.

The substrate 41 is made of, for example, an insulating resin material. The interconnect layers 42 and 43 are formed in the front surface of the substrate 41 as illustrated in FIG. 4B. The interconnect layers 42 and 43 are made of a metal material such as, for example, copper, etc.

Or, the interconnect layers 42 and 43 may be provided on a metal plate with an interposed insulating layer. Alternatively, the interconnect layers 42 and 43 may be provided on a ceramic substrate. In the case where the metal plate or the ceramic substrate is used, the heat dissipation and the reliability can be higher than the case where the resin substrate is used.

The interconnect layer 43 is formed in one continuous pattern extending in the longitudinal direction of the substrate 41. The interconnect layer 42 is divided into a plurality in the longitudinal direction of the substrate 41. The front surface of the substrate 41 is covered with the reflector 51. Portions 44 and 45 of the interconnect layer are exposed from the reflector 51 as illustrated in FIG. 4A. The exposed portions 44 and 45 of the interconnect layer are illustrated by broken lines in FIG. 4B. The portions 44 and 45 of the interconnect layer exposed on the substrate 41 are used as pads to which the LED package 1 is mounted.

For example, the pad 44 functions as an anode; and the pad 45 functions as a cathode. The LED package 1 is mounted on the pads 44 and 45 as illustrated in FIGS. 5A and 5B.

A portion of the interconnect layer 42 exposed from the reflector 51 at one longitudinal-direction end portion of the substrate 41 functions as the connector 46 of the anode side. A portion of the interconnect layer 43 exposed from the reflector 51 at the one longitudinal-direction end portion of the substrate 41 functions as the connector 47 of the cathode side. The connectors 46 and 47 are electrically connected to a not-illustrated external power source.

The multiple interconnect layers 42 divided on the substrate 41 are electrically connected to each other through the LED packages 1 mounted to the pads 44 and 45. The interconnect layer 42 provided at the other longitudinal-direction end portion of the substrate 41 (the end portion distal to the connectors 46 and 47) is electrically connected to the interconnect layer 43 which is continuous in the longitudinal direction of the substrate 41 through the mounted LED packages 1. The connector 47 of the cathode side is formed at the one end portion of the interconnect layer 43. Accordingly, the multiple LED packages 1 are connected in series between the connectors 46 and 47 through the interconnect layers 42 and 43.

As illustrated in FIG. 5B, the LED package 1 includes a first leadframe 11 and a second leadframe 12 separated from the first leadframe 11. The first leadframe 11 is bonded to the pad 45 via a conductive bonding agent 35; and the second leadframe 12 is bonded to the pad 44 via the conductive bonding agent 35. The conductive bonding agent 35 is, for example, solder or a paste including metal particles such as silver, etc.

The region of the front surface of the substrate 41 where the pads 44 and 45 are not exposed is covered with the reflector 51. The reflector 51 is an insulating film that is reflective with respect to the light emitted from the LED package 1. For example, the reflector 51 is made of a resin material that is a so-called white resist. The reflector 51 is formed on the entire surface of the front surface of the substrate 41 other than the regions where the LED packages 1 are mounted.

The LED package 1 of the embodiment will now be described.

Figure 7:
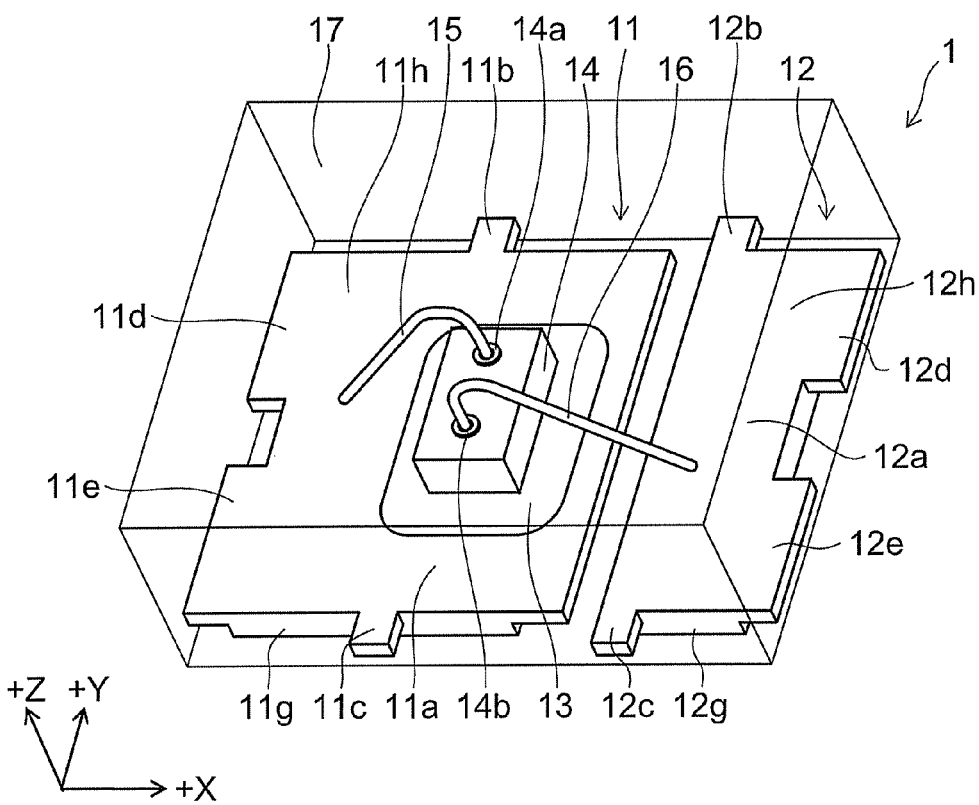
FIG. 7 is a schematic perspective view of an LED package of the light bar of the embodiment.

FIG. 7 is a schematic perspective view of the LED package 1 of the embodiment.

Figure 8A:
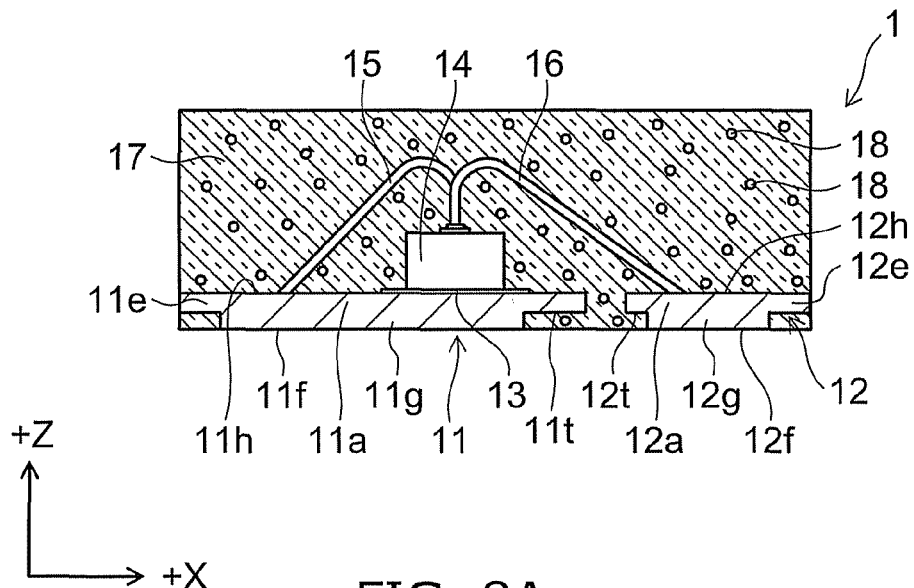
FIG. 8A is a schematic cross-sectional view of the LED package.
Figure 8B:
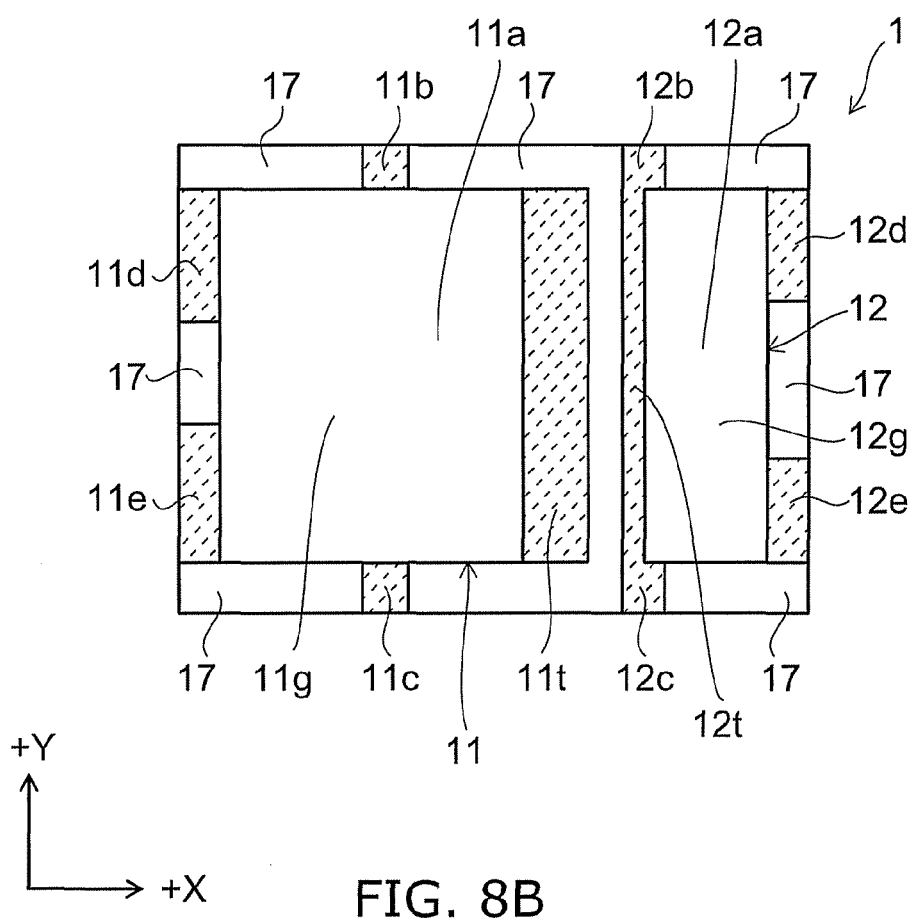
FIG. 8B is a schematic plan view of a leadframe.

FIG. 8A is a cross-sectional view of the LED package 1; and FIG. 8B is a bottom view of FIG. 8A.

The LED package 1 includes the first leadframe (hereinbelow also called simply the leadframe) 11 and the second leadframe (hereinbelow also called simply the leadframe) 12. The leadframes 11 and 12 have flat plate configurations. The leadframes 11 and 12 are disposed on the same plane and are separated from each other in the planar direction. The leadframes 11 and 12 are made of the same conductive material and have a structure in which, for example, silver plating layers are formed on the upper surface and the lower surface of a copper plate. The silver plating layers are not formed and the copper plate is exposed at the end surfaces of the leadframes 11 and 12.

Hereinbelow, for convenience of description in the specification, an XYZ orthogonal coordinate system is introduced. A direction parallel to the upper surfaces of the leadframes 11 and 12 from the leadframe 11 toward the leadframe 12 is taken as a +X direction. An upward direction perpendicular to the upper surfaces of the leadframes 11 and 12, that is, the direction in which an LED chip 14 is mounted as viewed from the leadframes, is taken as a +Z direction. One direction orthogonal to both the +X direction and the +Z direction is taken as a +Y direction. The directions opposite to the +X direction, the +Y direction, and the +Z direction are taken as a −X direction, a −Y direction, and a −Z direction, respectively. The +X direction and the −X direction, for example, also are generally referred to as simply the X direction.

The leadframe 11 includes on base portion 11a which is rectangular as viewed from the Z direction. Four extending portions 11b, 11c, 11d, and 11e extend from the base portion 11a.

The extending portion 11b extends toward the +Y direction from the X-direction central portion of the end edge of the base portion 11a facing the +Y direction. The extending portion 11c extends toward the −Y direction from the X-direction central portion of the end edge of the base portion 11a facing the −Y direction. The positions of the extending portions 11b and 11c in the X direction are the same. The extending portions 11d and 11e extend toward the −X direction from both end portions of the end edge of the base portion 11a facing the −X direction. Thus, the extending portions 11b to 11e extend respectively from three mutually different sides of the base portion 11a.

Compared to the leadframe 11, the length of the leadframe 12 is shorter in the X direction; and the lengths in the Y direction are the same. The leadframe 12 includes one base portion 12a which is rectangular as viewed from the Z direction. Four extending portions 12b, 12c, 12d, and 12e extend from the base portion 12a.

The extending portion 12b extends toward the +Y direction from the end portion on the −X direction side of the end edge of the base portion 12a facing the +Y direction. The extending portion 12c extends toward the −Y direction from the end portion on the −X direction side of the end edge of the base portion 12a facing the −Y direction. The extending portions 12d and 12e extend toward the +X direction from both end portions of the end edge of the base portion 12a facing the +X direction. Thus, the extending portions 12b to 12e extend respectively from three mutually different sides of the base portion 12a.

The widths of the extending portions 11d and 11e of the leadframe 11 may be the same as the widths of the extending portions 12d and 12e of the leadframe 12 or may be different. It is easy to discriminate between the anode and the cathode by making the widths of the extending portions 11d and 11e different from the widths of the extending portions 12d and 12e.

A protrusion 11g is formed in the X-direction central portion of the base portion 11a of a lower surface 11f of the leadframe 11. Therefore, the thickness of the leadframe 11 has two levels of values. The X-direction central portion of the base portion 11a, i.e., the portion where the protrusion 11g is formed, is relatively thick; and both of the X-direction end portions of the base portion 11a and the extending portions 11b to 11e are relatively thin. In FIG. 8B, the portion of the base portion 11a where the protrusion 11g is not formed is illustrated as a thin plate portion 11t.

A protrusion 12g is formed in the X-direction central portion of the base portion 12a of a lower surface 12f of the leadframe 12. Thereby, the thickness of the leadframe 12 also has two levels of values. The X-direction central portion of the base portion 12a is relatively thick because the protrusion 12g is formed; and both of the X-direction end portions of the base portion 12a and the extending portions 12b to 12e are relatively thin. In FIG. 8B, the portion of the base portion 12a where the protrusion 12g is not formed is illustrated as a thin plate portion 12t.

Notches extending in the Y direction are made respectively in the lower surfaces of both of the X-direction end portions of the base portions 11a and 12a along the end edges of the base portions 11a and 12a. In FIG. 8B, the relatively thin portions of the leadframes 11 and 12, i.e., the thin plate portions and the extending portions, are illustrated by broken line hatching.

The protrusions 11g and 12g are formed in regions of the leadframes 11 and 12 distal to the mutually-opposing end edges. The regions of the leadframes 11 and 12 including the mutually-opposing end edges are the thin plate portions 11t and 12t.

An upper surface 11h of the leadframe 11 and an upper surface 12h of the leadframe 12 are on the same plane. The lower surface of the protrusion 11g of the leadframe 11 and the lower surface of the protrusion 12g of the leadframe 12 are on the same plane. The position of the upper surface of each of the extending portions in the Z direction matches the positions of the upper surfaces of the leadframes 11 and 12. Accordingly, each of the extending portions is disposed on the same XY plane.

A die mount material 13 is bonded to cover a portion of the region of the upper surface 11h of the leadframe 11 corresponding to the base portion 11a. The die mount material 13 may be conductive or insulative. For example, silver paste, solder, eutectic solder, etc., may be used as the conductive die mount material 13. For example, a transparent resin paste may be used as the insulative die mount material 13.

The LED chip 14 is mounted on the die mount material 13. The LED chip 14 is affixed to the leadframe 11 by the die mount material 13. The LED chip 14 has, for example, a structure in which a semiconductor layer including a light emitting layer made of gallium nitride (GaN), etc., is stacked on a sapphire substrate. The configuration of the LED chip 14 is, for example, a rectangular parallelepiped; and terminals 14a and 14b are provided in the upper surface thereof. The LED chip 14 emits, for example, a blue light by a current being injected into the light emitting layer by a voltage being supplied between the terminal 14a and the terminal 14b.

One end of a wire 15 is bonded to the terminal 14a of the LED chip 14. The wire 15 is drawn out from the terminal 14a in the +Z direction (the upward perpendicular direction) and curves toward a direction between the −X direction and the −Z direction; and the other end of the wire 15 is bonded to the upper surface 11h of the leadframe 11. Thereby, the terminal 14a is connected to the leadframe 11 via the wire 15.

On the other hand, one end of a wire 16 is bonded to the terminal 14b. The wire 16 is drawn out from the terminal 14b in the +Z direction and curves toward a direction between the +X direction and the −Z direction; and the other end of the wire 16 is bonded to the upper surface 12h of the leadframe 12. Thereby, the terminal 14b is connected to the leadframe 12 via the wire 16. The wires 15 and 16 are formed of a metal, e.g., gold or aluminum.

The LED package 1 further includes a transparent resin body 17. The transparent resin body 17 is a resin transparent to the light emitted from the LED chip 14, e.g., a silicone resin. "Transparent" also includes being semi-transparent. The exterior form of the transparent resin body 17 is, for example, a rectangular parallelepiped. The leadframes 11 and 12, the die mount material 13, the LED chip 14, and the wires 15 and 16 are buried in the transparent resin body 17. In other words, the exterior form of the transparent resin body 17 is used as the exterior form of the LED package 1.

A portion of the leadframe 11 and a portion of the leadframe 12 are exposed at the lower surface and the side surface of the transparent resin body 17. In other words, the transparent resin body 17 covers the LED chip 14, covers the upper surface, a portion of the lower surface, and a portion of the end surface of the leadframe 11, and covers the upper surface, a portion of the lower surface, and a portion of the end surface of the leadframe 12. The remaining portion of the lower surface and the remaining portion of the end surface of the leadframe 11 and the remaining portion of the lower surface and the remaining portion of the end surface of the leadframe 12 are exposed from the transparent resin body 17. In the specification, the concept of covering includes both the case of the covering component being in contact with the covered component and the case of not being in contact.

In particular, the lower surface of the protrusion 11g of the lower surface 11f of the leadframe 11 is exposed at the lower surface of the transparent resin body 17; and the tip surfaces of the extending portions 11b to 11e are exposed at the side surface of the transparent resin body 17. On the other hand, the transparent resin body 17 covers the entire upper surface 11h of the leadframe 11, the regions of the lower surface 11f other than the protrusion 11g, i.e., the lower surfaces of the extending portions and the thin plate portions, the side surface of the protrusion 11g, and the end surface of the base portion 11a.

Similarly, the lower surface of the protrusion 12g of the leadframe 12 is exposed at the lower surface of the transparent resin body 17; the tip surfaces of the extending portions 12b to 12e are exposed at the side surface of the transparent resin body 17; and the transparent resin body 17 covers the entire upper surface 12h and the regions of the lower surface 12f other than the protrusion 12g, i.e., the lower surfaces of the extending portions and the thin plate portions, the side surface of the protrusion 12g, and the end surface of the base portion 12a.

In the LED package 1, the lower surfaces of the protrusions 11g and 12g exposed at the lower surface of the transparent resin body 17 are used as external electrode pads. In other words, the lower surface of the protrusion 11g is bonded to the pad 45 described above; and the lower surface of the protrusion 12g is bonded to the pad 44. The configuration of the transparent resin body 17 is rectangular when viewed in the top view; and the tip surfaces of the multiple extending portions are exposed at three mutually different side surfaces of the transparent resin body 17.

Many phosphors 18 are dispersed in the interior of the transparent resin body 17. Each of the phosphors 18 has a granular configuration and is configured to absorb the light emitted from the LED chip 14 and emit light of a longer wavelength. The transparent resin body 17 is transmissive also with respect to the light emitted by the phosphor 18.

For example, the phosphor 18 absorbs a portion of the blue light emitted from the LED chip 14 and emits yellow light. Thereby, the LED package 1 emits the blue light that is emitted by the LED chip 14 and not absorbed into the phosphor 18 and the yellow light that is emitted from the phosphor 18; and the emitted light as an entirety is white.

A silicate-based phosphor that emits yellowish-green, yellow, or orange light, for example, can be used as the phosphor 18. The silicate-based phosphor can be represented by the following general formula.

$$(2-x-y)SrO \cdot x(Ba_uCa_v)O \cdot (1-a-b-c-d)SiO_2 \cdot aP_2O_5 bAl_2O_3 cB_2O_3 dGeO_2 : yEu^{2+}$$

where $0<x$, $0.005<y<0.5$, $x+y \leq 1.6$, $0 \leq a, b, c, d < 0.5$, $0<u$, $0<v$, and $u+v=1$.

A YAG-based phosphor also can be used as the yellow phosphor. The YAG-based phosphor can be represented by the following general formula.

$$(RE_{1-x}Sm_x)_3(Al_yGa_{1-y})_5O_{12}:Ce$$

where $0 \leq x < 1$, $0 \leq y \leq 1$, and RE is at least one type of element selected from Y and Gd.

Or, a SiAlON-based red phosphor and green phosphor can be mixed and used as the phosphor 18. In other words, the phosphor 18 may be a green phosphor that absorbs the blue light emitted from the LED chip 14 to emit green light and a red phosphor that absorbs the blue light to emit red light.

The SiAlON-based red phosphor can be represented by, for example, the general formula recited below.

$$(M_{1-x}R_x)_{a1}AlSi_{b1}O_{c1}N_{d1}$$

where M is at least one type of metal element excluding Si and Al, and it may be used for M to be at least one selected from Ca and Sr; R is a light emission center element, and it may be used for R to be Eu; and x, a1, b1, c1, and d1 satisfy the relationships $0<x \leq 1$, $0.6<a1<0.95$, $2<b1<3.9$, $0.25<c1<0.45$, and $4<d1<5.7$.

A specific example of such a SiAlON-based red phosphor is as follows.

$$Sr_2Si_7Al_7ON_{13}:Eu^{2+}$$

The SiAlON-based green phosphor can be represented by, for example, the general formula recited below.

$$(M_{1-x}R_x)_{a2}AlSi_{b2}O_{c2}N_{d2}$$

where M is at least one type of metal element excluding Si and Al, and it may be used for M to be at least one selected from Ca and Sr; R is a light emission center element, and it may be used for R to be Eu; and x, a2, b2, c2, and d2 satisfy the relationships $0<x \leq 1$, $0.93<a2<1.3$, $4.0<b2<5.8$, $0.6<c2<1$, and $6<d2<11$.

A specific example of such a SiAlON-based green phosphor is as follows.

$$Sr_3Si_{13}Al_3O_2N_{21}:Eu^{2+}$$

A method for manufacturing the LED package of the embodiment will now be described.

Figure 9:
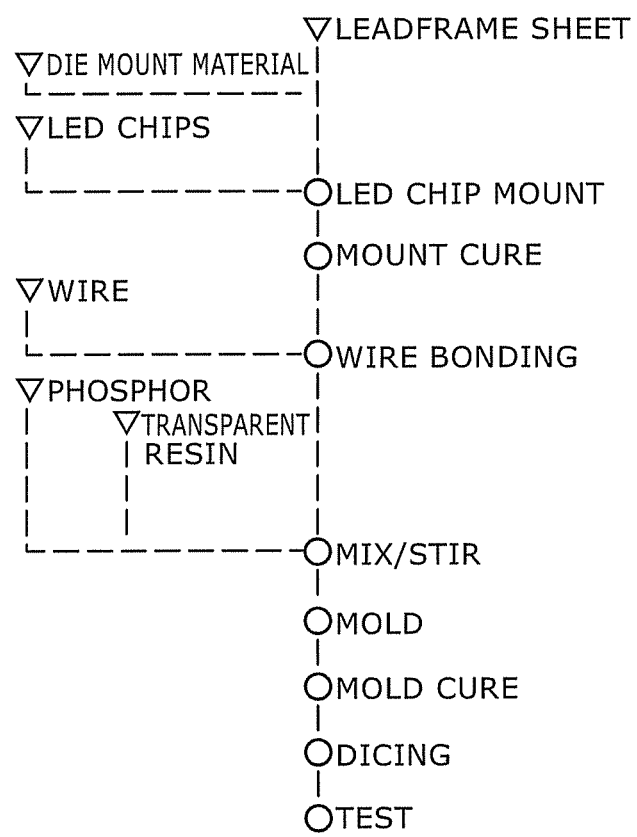
FIG. 9 is a flowchart illustrating a method for manufacturing the LED package.

FIG. 9 is a flowchart illustrating the method for manufacturing the LED package of the embodiment.

FIG. 10A to FIG. 12B are cross-sectional views of processes, illustrating the method for manufacturing the LED package of the embodiment.

Figure 13A:
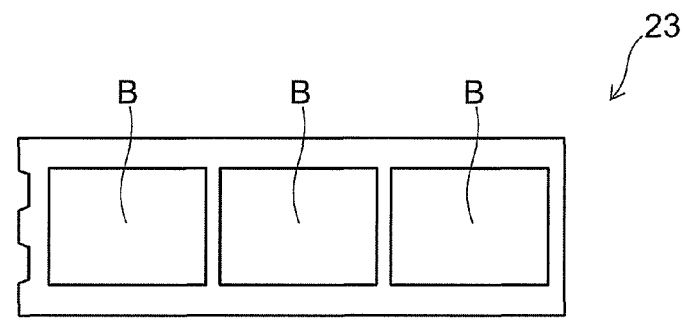
FIGS. 13A and 13B are schematic plan views illustrating a leadframe sheet.
Figure 13B:
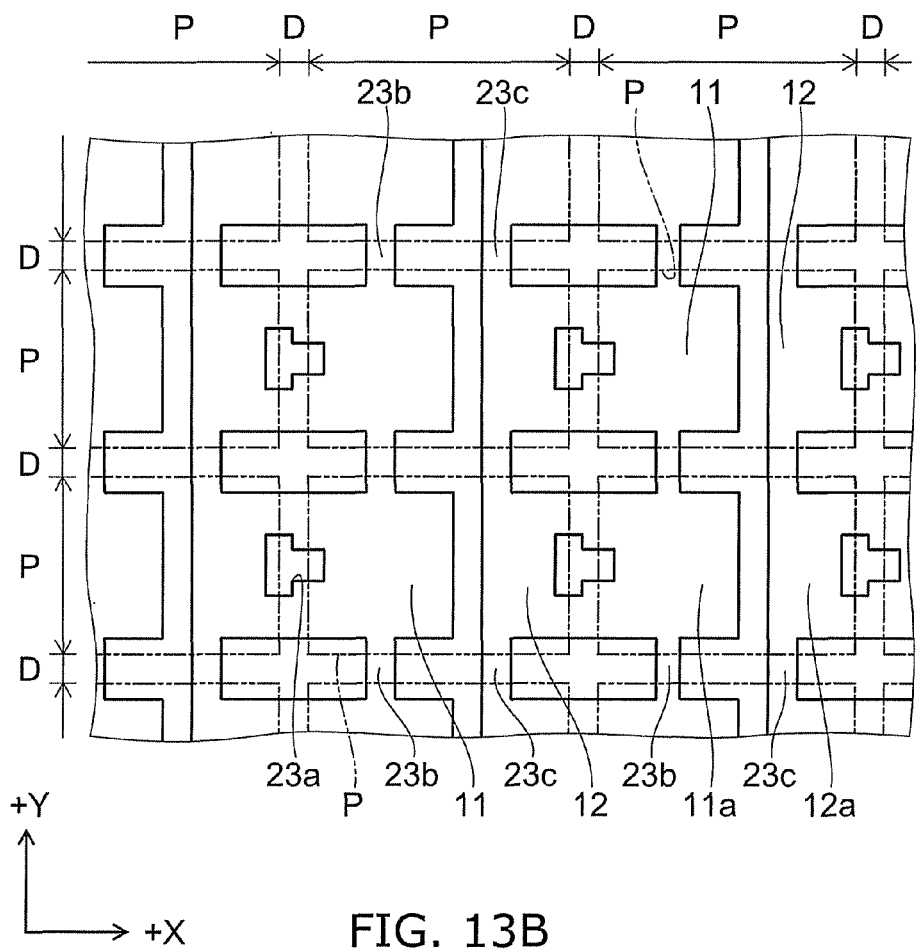

FIG. 13A is a plan view illustrating a leadframe sheet of the embodiment; and FIG. 13B is a partially-enlarged plan view illustrating device regions of the leadframe sheet.

Figure 10A:
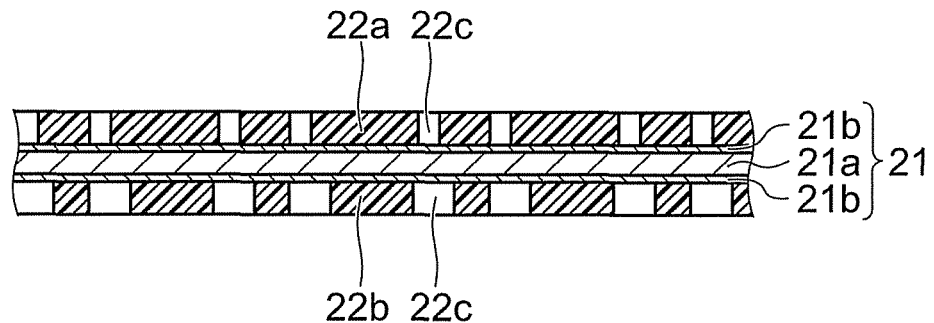
FIG. 10A to FIG. 12B are cross-sectional views of processes illustrating the method for manufacturing the LED package.

First, as illustrated in FIG. 10A, a conductive sheet 21 made of a conductive material is prepared. The conductive sheet 21 includes, for example, silver plating layers 21b plated on the upper surface and the lower surface of a copper plate 21a having a rectangular configuration. Then, masks 22a and 22b are formed on the upper surface and the lower surface of the conductive sheet 21. Openings 22c are made selectively in the masks 22a and 22b. The masks 22a and 22b may be formed using, for example, printing.

Then, wet etching is performed on the conductive sheet 21 over which the masks 22a and 22b are bonded by immersing the conductive sheet 21 in an etchant. Thereby, the portions of the conductive sheet 21 positioned inside the openings 22c are selectively removed by etching. At this time, the etching amount is controlled by adjusting, for example, the immersion time; and the etching is stopped before the etching from the upper surface side of the conductive sheet 21 or the etching from the lower surface side of the conductive sheet 21 independently pierces the conductive sheet 21. Thereby, half-etching is performed from the upper surface side and the lower surface side. However, portions etched from both the upper surface side and the lower surface side pierce the conductive sheet 21. Subsequently, the masks 22a and 22b are removed.

Figure 10B:
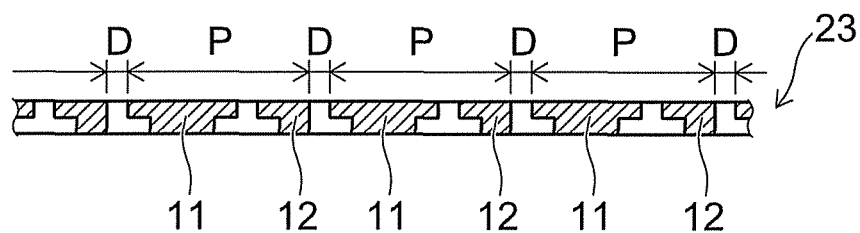

Thereby, as illustrated in FIG. 9 and FIG. 10B, the copper plate 21a and the silver plating layers 21b are selectively removed from the conductive sheet 21 to form a leadframe sheet 23. For convenience of illustration in FIG. 10B and subsequent drawings, the copper plate 21a and the silver plating layers 21b are illustrated integrally as the leadframe sheet 23 without being discriminated.

In the leadframe sheet 23 as illustrated in FIG. 13A, for example, three blocks B are set; and, for example, about 1000 device regions P are set in each of the blocks B. As illustrated in FIG. 13B, the device regions P are arranged in a matrix configuration; and the region between the device regions P is used as a dicing region D having a lattice configuration. A basic pattern including the mutually-separated leadframes 11 and 12 is formed in each of the device regions P. In the dicing region D, the conductive material of the conductive sheet 21 remains to link mutually-adjacent device regions P to each other.

In other words, although the leadframe 11 and the leadframe 12 are separated from each other in the device region P, the leadframe 11 belonging to one of the device regions P is linked to the leadframe 12 belonging to the adjacent device region P positioned in the −X direction as viewed from the one of the device regions P; and an opening 23a having a protruding configuration facing the +X direction is made between the two frames.

The leadframes 11 belonging to the device regions P adjacent to each other in the Y direction are linked to each other via a bridge 23b. Similarly, the leadframes 12 belonging to the device regions P adjacent to each other in the Y direction are linked to each other via a bridge 23c. Thereby, four conductive members extend toward three directions from the base portions 11a and 12a of the leadframes 11 and 12. The protrusions 11g and 12g (referring to FIG. 8A) are formed on the lower surfaces of the leadframes 11 and 12 respectively by the etching from the lower surface side of the leadframe sheet 23 being half-etching.

Figure 10C:
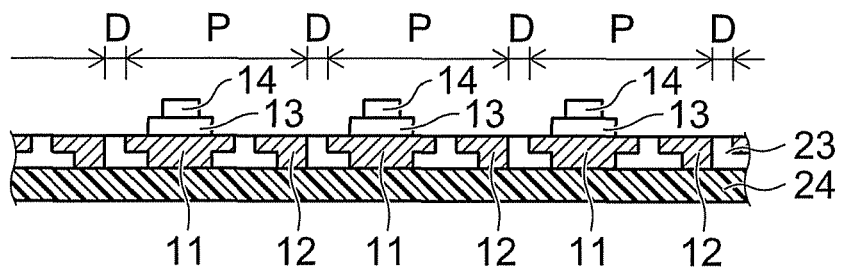

Then, as illustrated in FIG. 9 and FIG. 10C, a reinforcing tape 24 made of, for example, polyimide is adhered to the lower surface of the leadframe sheet 23. Continuing, the die mount material 13 is bonded to cover the leadframe 11 belonging to each of the device regions P of the leadframe sheet 23. For example, the die mount material 13 having a paste configuration may be dispensed onto the leadframe 11 from a dispenser or transferred onto the leadframe 11 using mechanical means.

Then, the LED chip 14 is mounted on the die mount material 13. Then, heat treatment (mount cure) is performed to cure the die mount material 13. Thereby, the LED chip 14 is mounted via the die mount material 13 on the leadframe 11 of each of the device regions P of the leadframe sheet 23.

Figure 10D:
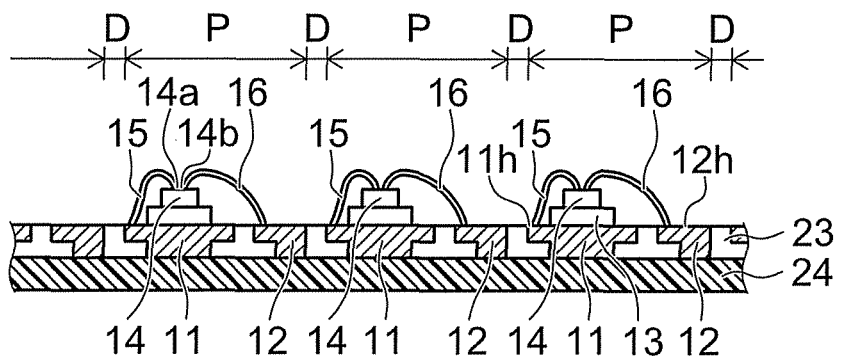

Continuing as illustrated in FIG. 9 and FIG. 10D, one end of the wire 15 is bonded to the terminal 14a of the LED chip 14 and the other end is bonded to the upper surface of the leadframe 11 using, for example, ultrasonic bonding. One end of the wire 16 is bonded to the terminal 14b of the LED chip 14; and the other end is bonded to the upper surface 12h of the leadframe 12. Thereby, the terminal 14a is connected to the leadframe 11 via the wire 15; and the terminal 14b is connected to the leadframe 12 via the wire 16.

Figure 11A:
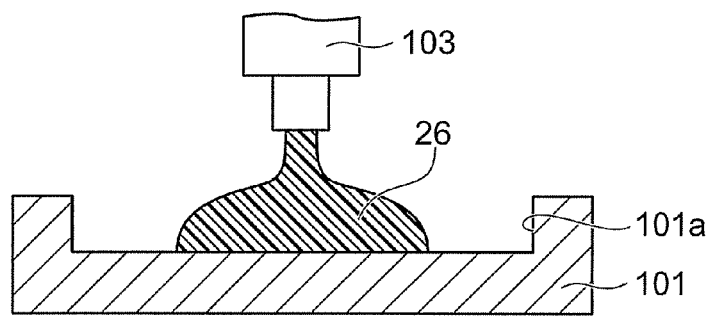

Then, as illustrated in FIG. 9 and FIG. 11A, a lower die 101 is prepared. The lower die 101 is included in one die set with an upper die 102 described below; and a recess 101a having a rectangular parallelepiped configuration is made in the upper surface of the lower die 101. On the other hand, a liquid or semi-liquid phosphor-containing resin material 26 is prepared by mixing the phosphor 18 (referring to FIG. 8A) into a transparent resin such as a silicone resin and stirring. Then, the phosphor-containing resin material 26 is supplied to the recess 101a of the lower die 101 using a dispenser 103.

Figure 11B:
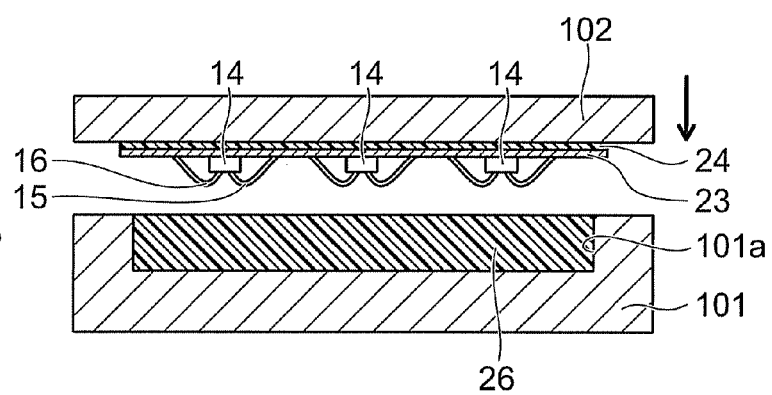

Continuing as illustrated in FIG. 9 and FIG. 11B, the leadframe sheet 23 on which the LED chips 14 described above are mounted is mounted to the lower surface of the upper die 102 such that the LED chips 14 face downward. Then, the die is closed by pressing the upper die 102 onto the lower die 101. Thereby, the leadframe sheet 23 is pressed onto the phosphor-containing resin material 26. At this time, the phosphor-containing resin material 26 covers the LED chips 14 and the wires 15 and 16 and enters also into the portion of the leadframe sheet 23 removed by the etching. Thus, the phosphor-containing resin material 26 is molded.

Figure 11C:
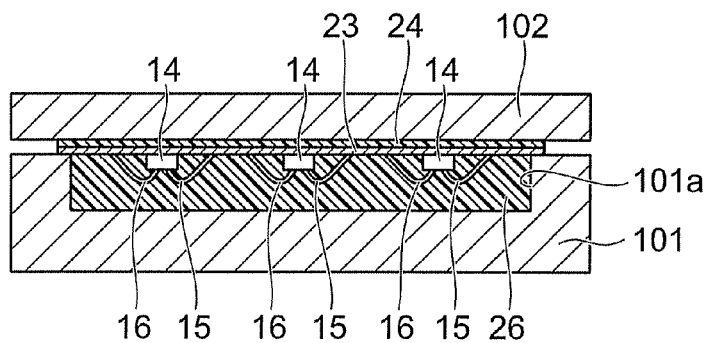
Figure 12A:
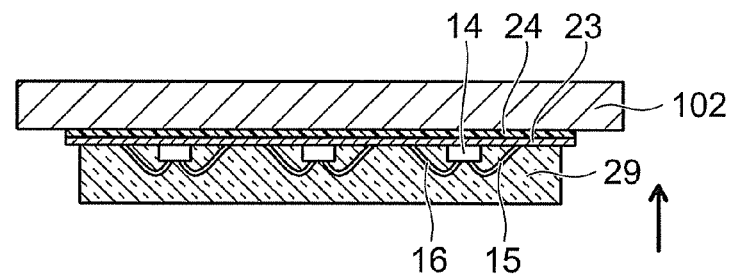

Then, as illustrated in FIG. 9 and FIG. 11C, heat treatment (mold cure) is performed in a state in which the upper surface of the leadframe sheet 23 is pressed onto the phosphor-containing resin material 26 to cure the phosphor-containing resin material 26. Subsequently, as illustrated in FIG. 12A, the upper die 102 is pulled away from the lower die 101. Thereby, a transparent resin plate 29 is formed on the leadframe sheet 23 to cover the entire upper surface and a portion of the lower surface of the leadframe sheet 23 to bury the LED chips 14, etc. The phosphor 18 (referring to FIG. 8A) is dispersed in the transparent resin plate 29. Subsequently, the reinforcing tape 24 is peeled from the leadframe sheet 23. Thereby, the lower surfaces of the protrusions 11g and 12g of the leadframes 11 and 12 (referring to FIG. 8A) are exposed at the surface of the transparent resin plate 29.

Figure 12B:
Figure 12B:
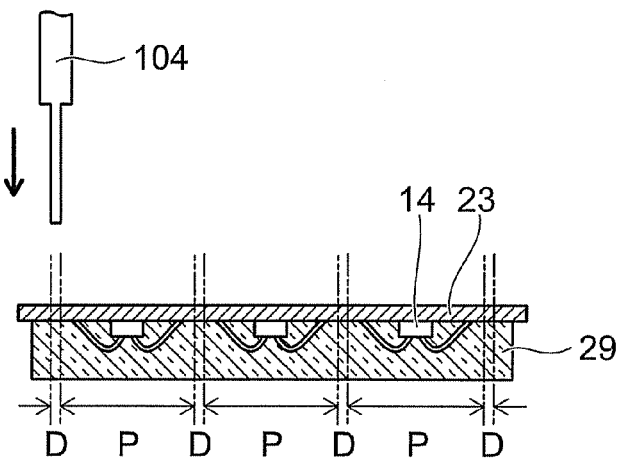

Then, as illustrated in FIG. 9 and FIG. 12B, dicing is performed on the bonded body made of the leadframe sheet 23 and the transparent resin plate 29 from the leadframe sheet 23 side using a blade 104. In other words, dicing is performed from the −Z direction side toward the +Z direction. Thereby, the portions of the leadframe sheet 23 and the transparent resin plate 29 disposed in the dicing region D are removed.

As a result, the portions of the leadframe sheet 23 and the transparent resin plate 29 disposed in the device regions P are singulated; and the LED package 1 illustrated in FIG. 7 and FIGS. 8A and 8B is manufactured. The bonded body made of the leadframe sheet 23 and the transparent resin plate 29 may be diced from the transparent resin body 29 side.

The leadframes 11 and 12 are separated from the leadframe sheet 23 in each of the LED packages 1 after the dicing. The transparent resin plate 29 is divided to form the transparent resin body 17. The extending portions 11d, 11e, 12d, and 12e are formed in the leadframes 11 and 12 respectively by the portion of the dicing region D that extends in the Y direction to pass through the openings 23a of the leadframe sheet 23. The extending portions 11b and 11c are formed in the leadframe 11 by the bridge 23b being divided; and the extending portions 12b and 12c are formed in the leadframe 12 by the bridge 23c being divided. The tip surfaces of the extending portions 11b to 11e and 12b to 12e are exposed at the side surface of the transparent resin body 17.

Then, as illustrated in FIG. 9, various tests are performed on the LED package 1. At this time, it is also possible to use the tip surfaces of the extending portions 11b to 11e and 12b to 12e as the terminals for the tests.

Because a casing made of a white resin is not provided in the LED package 1 according to the embodiment, the casing does not degrade by absorbing the light and the heat generated by the LED chip 14. Although the degradation progresses easily particularly in the case where the casing is formed of a polyamide-based thermoplastic resin, there is no such risk in the embodiment. Therefore, the LED package 1 according to the embodiment has high durability. Accordingly, the LED package 1 according to the embodiment has a long life, high reliability, and is applicable to a wide range of applications.

In the LED package 1 according to the embodiment, the transparent resin body 17 is formed of a silicone resin. The durability of the LED package 1 also increases because the silicone resin has high durability to the light and the heat.

In the LED package 1 according to the embodiment, the light is emitted toward a wide angle because a casing covering the side surface of the transparent resin body 17 is not provided. Therefore, the LED package 1 according to the embodiment is advantageous when used in applications in which it is necessary for the light to be emitted at a wide angle, e.g., the backlight of a liquid crystal display apparatus and illumination.

In the LED package 1 according to the embodiment, the transparent resin body 17 holds the peripheral portions of the leadframes 11 and 12 by covering a portion of the lower surfaces and the greater part of the end surfaces of the leadframes 11 and 12. Therefore, the leadframes 11 and 12 can be held better while realizing the external electrode pads by exposing the lower surfaces of the protrusions 11g and 12g of the leadframes 11 and 12 from the transparent resin body 17.

In other words, notches are realized at both of the X-direction end portions of the lower surfaces of the base portions 11a and 12a by forming the protrusions 11g and 12g in the X-direction central portions of the base portions 11a and 12a. The leadframes 11 and 12 can be securely held by the transparent resin body 17 extending around inside the notches. Thereby, the leadframes 11 and 12 do not easily peel from the transparent resin body 17 during the dicing; and the yield of the LED package 1 can be increased.

Further, in the LED package 1 according to the embodiment, the silver plating layers are formed on the upper surfaces and the lower surfaces of the leadframes 11 and 12. The light extraction efficiency of the LED package 1 according to the embodiment is high because the silver plating layers have high optical reflectance of the light.

In the embodiment, many, e.g., about several thousand, of the LED packages 1 can be collectively manufactured from one conductive sheet 21. Thereby, the manufacturing cost per LED package 1 can be reduced. The number of parts, the number of processes, and the costs are low because the casing is not provided.

Furthermore, in the embodiment, the leadframe sheet 23 is formed using wet etching. Therefore, it is sufficient to prepare only the form of the masks when manufacturing the LED package with a new layout; and the initial cost can be kept lower than the case where the leadframe sheet 23 is formed using a method such as stamping with a die, etc.

In the LED package 1 according to the embodiment, the extending portions extend from the base portions 11a and 12a of the leadframes 11 and 12. Thereby, the base portions themselves are prevented from being exposed at the side surface of the transparent resin body 17; and the exposed surface area of the leadframes 11 and 12 can be reduced. As a result, the leadframes 11 and 12 can be prevented from peeling from the transparent resin body 17. Corrosion of the leadframes 11 and 12 also can be suppressed.

Considering these effects from the aspect of the manufacturing method, the metal portions interposed in the dicing region D are reduced by providing the opening 23a and the bridges 23b and 23c to be interposed in the dicing region D of the leadframe sheet 23 as illustrated in FIG. 13B. Thereby, the dicing is easier; and wear of the dicing blade can be suppressed.

Also, in the embodiment, four extending portions extend in three directions from each of the leadframes 11 and 12. Thereby, the mountability is high because the leadframe 11 is reliably supported from the three directions by the leadframes 11 and 12 of the adjacent device regions P in the mount process of the LED chip 14 illustrated in FIG. 10C. Similarly, in the wire bonding process illustrated in FIG. 10D, for example, there is not much loss of the ultrasonic waves applied during the ultrasonic bonding and good bonding of the wires to the leadframes and the LED chip can be provided because the bonding positions of the wires are reliably supported from the three directions.

In the embodiment, the dicing is performed from the leadframe sheet 23 side in the dicing process illustrated in FIG. 12B. Thereby, the metal material of the cutting end portions of the leadframes 11 and 12 elongates over the side surface of the transparent resin body 17 in the +Z direction. Therefore, this metal material does not elongate over the side surface of the transparent resin body 17 in the −Z direction to protrude from the lower surface of the LED package 1; and burrs do not occur. Accordingly, mounting defects due to burrs do not occur when mounting the LED package 1.

The light bar 10 described above on which the LED packages 1 are mounted may be used as a light source of an illumination apparatus (a backlight) as described above referring to FIG. 1A.

A portion of the light emitted from the LED packages 1 is directly incident on the light incident surface 77a of the light guide plate 77. The light entering the light guide plate 77 from the light incident surface 77a spreads in the surface direction of the light guide plate 77, is emitted from the light emergence surface 77b, and is incident on the liquid crystal panel. The light emitted from the light guide plate 77 toward the side of the light guide plate 77 opposite to the liquid crystal panel is guided toward the liquid crystal panel by being reflected by the reflective sheet 76 under the light guide plate 77.

In the embodiment as described above, the light bar 10 is tilted toward the reflective surface 76a side. Therefore, the light emitted from the LED packages 1 can be guided toward the incident surface 77a of the light guide plate 77 by being reflected by the reflective sheet 76. In other words, the light emitted from the LED packages 1 is easily incident on the reflective surface 76a; and the light is easily guided toward the light incident surface 77a of the light guide plate 77 by utilizing the reflection of the reflective surface 76a. Because the reflector 51 described above is formed on the front surface of the substrate 41, the proportion of light entering the light incident surface 77a can be increased also by the reflection by the reflector 51.

By tilting the light bar 10 toward the reflective surface 76a side, the space between the light bar 10 and the light incident surface 77a of the light guide plate 77 where the reflective surface 76a does not exist, which is the upper part of the space in the drawing, can be narrow. In other words, the substrate 41 of the light bar 10 includes a first end portion 41a positioned on the support body 74 side as viewed from the width direction of the substrate 41 (the direction orthogonal to the longitudinal direction recited above) and a second end portion 41b positioned on the side opposite to the first end portion 41a with the LED packages 1 interposed therebetween. The distance between the second end portion 41b and the light incident surface 77a of the light guide plate 77 is shorter than the distance between the first end portion 41a and the light incident surface 77a of the light guide plate 77. Thereby, the light leaking outside the space recited above without entering the light guide plate 77 can be reduced.

In other words, the embodiment can provide an illumination apparatus having a high utilization efficiency of the light emitted from the LED packages 1 by increasing the proportion of light entering the light guide plate 77.

In the LED package 1 according to the embodiment, the light is emitted toward a wide angle because a casing covering the side surface of the transparent resin body 17 is not provided. Therefore, the embodiment is extremely effective when used as, for example, the light source of a backlight because the light emitted from the LED packages 1 is efficiently guided toward the light incident surface 77a of the light guide plate 77.

Figure 1B:
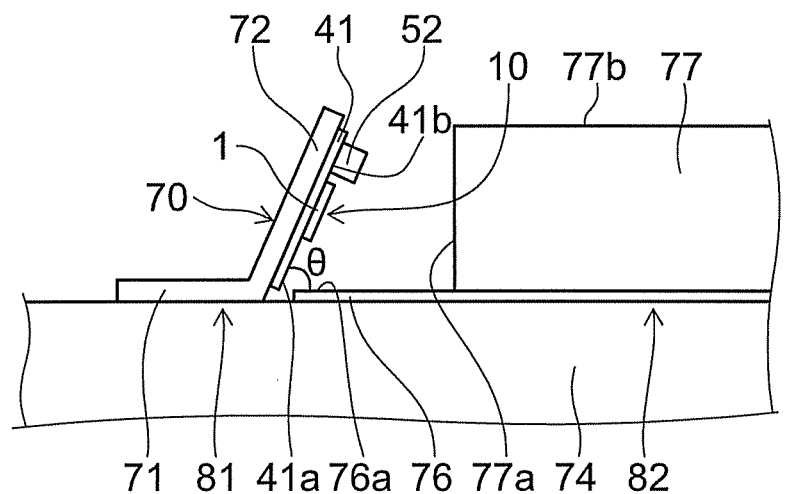
Figure 16:
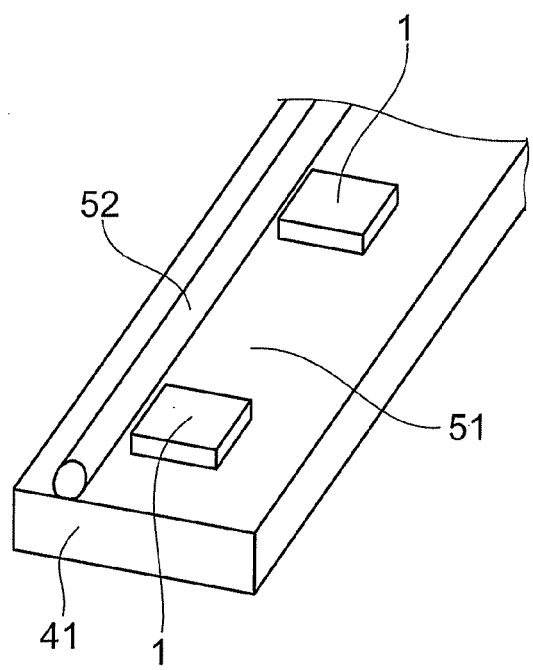
FIG. 16 is a perspective view of a light bar illustrating in FIG. 1B.

As illustrated in FIG. 1B, a reflector 52 may be provided at the second end portion 41b of the substrate 41. The reflector 52 is reflective with respect to the light emitted from the LED package and is made of, for example, a resin material. The reflector 52 is provided as a protrusion protruding from the front surface of the substrate 41. The reflector 52 extends in the longitudinal direction of the substrate 41 as illustrated in FIG. 16.

By providing the reflector 52, the light leaking upward from the space between the light bar 10 and the light incident surface 77a can be reduced further. The light leaking upward from the space recited above can be reduced further and the light guided to the light incident surface 77a of the light guide plate 77 can be increased further by the protruding height of the reflector 52 in the thickness direction of the substrate 41 being not less than the protruding height of the LED package 1 in the thickness direction of the substrate 41.

Figure 2A:
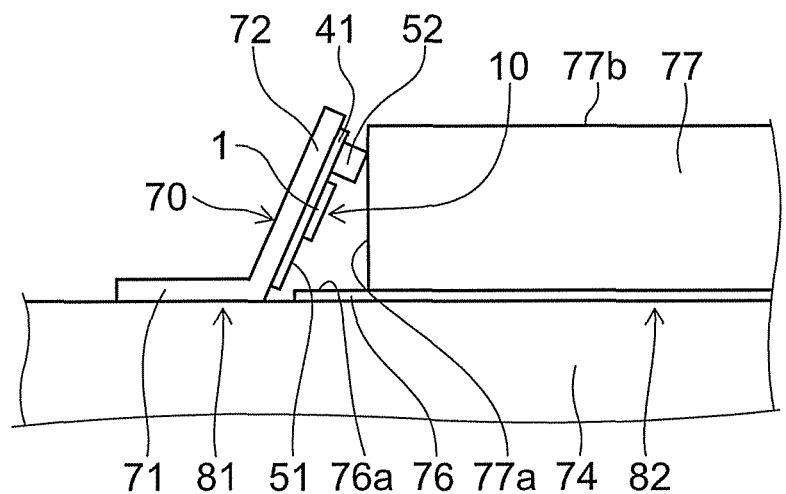
FIGS. 2A and 2B are schematic side views of an illumination apparatus of another embodiment.

As illustrated in FIG. 2A, the light leaking upward from the space between the light bar 10 and the light incident surface 77a can be drastically reduced or substantially eliminated by the light incident surface 77a of the light guide plate 77 being in contact with the reflector 52.

Figure 2B:
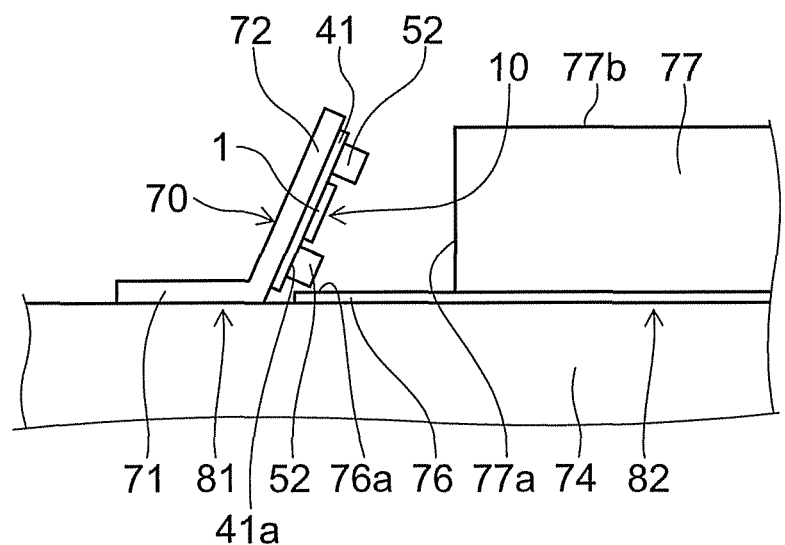

As illustrated in FIG. 2B, the reflector 52 may be provided at the first end portion 41a of the substrate 41. The light guided to the light incident surface 77a of the light guide plate 77 can be increased further by the protruding height of the reflector 52 provided at the first end portion 41a in the thickness direction of the substrate 41 being not less than the protruding height of the LED package 1 in the thickness direction of the substrate 41.

Figure 14:
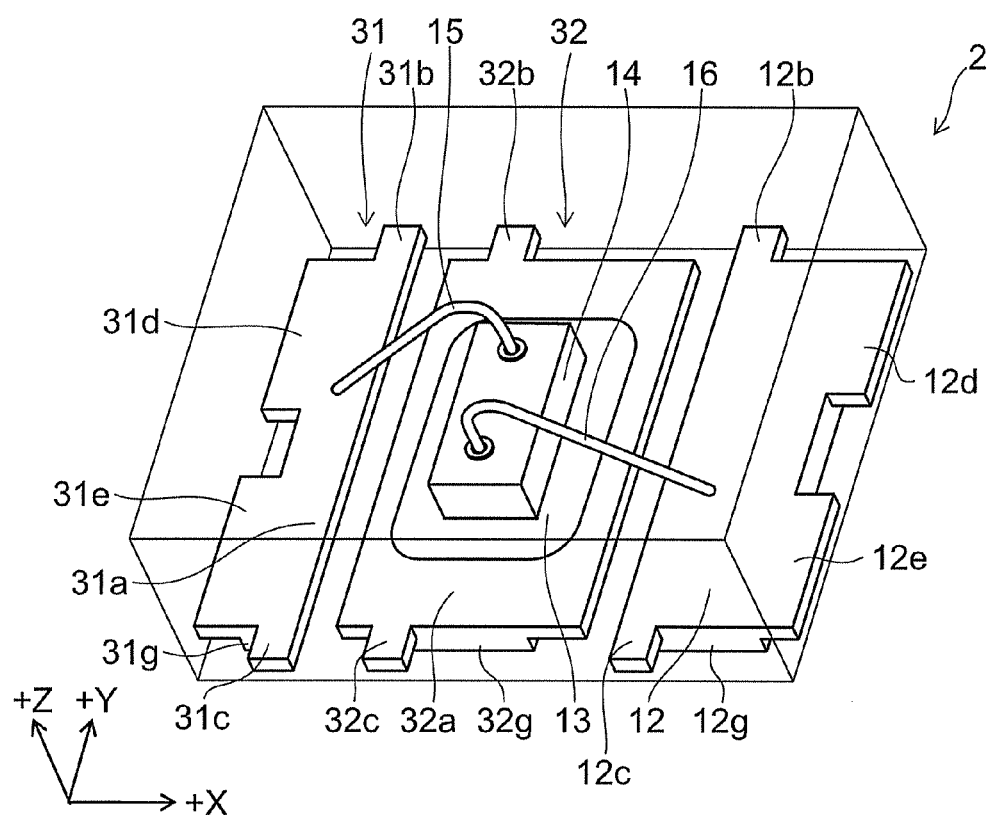
FIG. 14 is a schematic perspective view of an LED package of a light bar of another embodiment.
Figure 15:
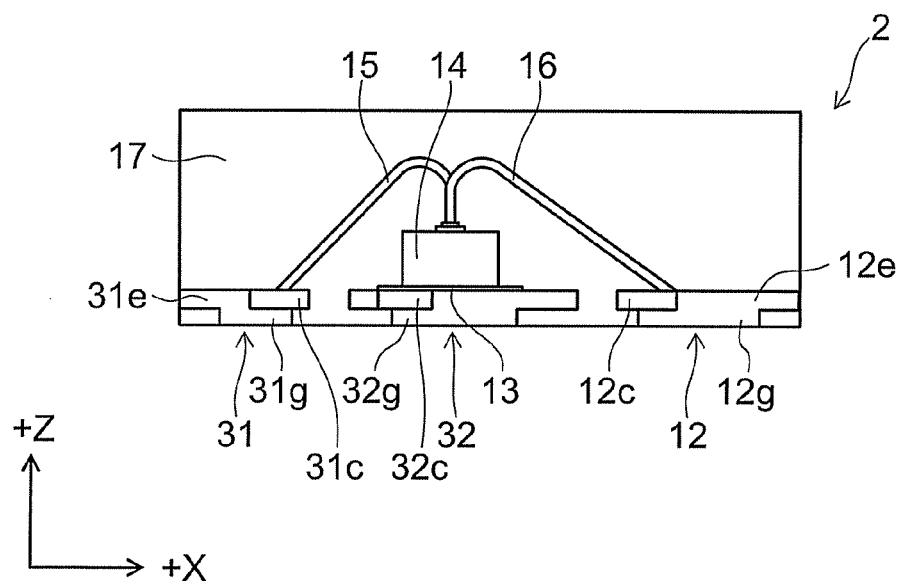
FIG. 15 is a schematic cross-sectional view of the LED package illustrating in FIG. 14.

FIG. 14 is a perspective view illustrating an LED package according to another embodiment; and FIG. 15 is a cross-sectional view illustrating the LED package 2.

The LED package 2 of the embodiment differs from the LED package 1 of the embodiment described above (referring to FIG. 7 and FIGS. 8A and 8B) in that the leadframe 11 is subdivided into two leadframes 31 and 32 in the X direction.

The leadframe 32 is disposed between the leadframe 31 and the leadframe 12. In the leadframe 31, extending portions 31d and 31e corresponding to the extending portions 11d and 11e of the leadframe 11 are formed; and extending portions 31b and 31c extending from a base portion 31a in the +Y direction and the −Y direction respectively are formed. The X-direction positions of the extending portions 31b and 31c are the same. The wire 15 is bonded to the leadframe 31.

On the other hand, in the leadframe 32, extending portions 32b and 32c corresponding to the extending portions 11b and 11c of the leadframe 11 are formed; and the LED chip 14 is mounted via the die mount material 13. Protrusions corresponding to the protrusion 11g of the leadframe 11 are formed as protrusions 31g and 32g by the subdivision into the leadframes 31 and 32.

In the embodiment, the leadframes 31 and 12 function as external electrodes by potentials being applied from the outside. On the other hand, it is unnecessary to apply a potential to the leadframe 32; and the leadframe 32 can be used as a dedicated heat sink leadframe. Thereby, the leadframe 32 can be connected to a common heat sink in the case where multiple LED packages 2 are mounted to one module. The grounding potential may be applied to the leadframe 32; and the leadframe 32 may be in a floating state.

A so-called Manhattan phenomenon can be suppressed by bonding solder balls respectively to the leadframes 31, 32, and 12 when mounting the LED package 2 to a motherboard. The Manhattan phenomenon refers to a phenomenon in which the device undesirably becomes upright due to a shift in the timing of the melting of the solder balls and the surface tension of the solder in the reflow oven when mounting the device to the substrate via multiple solder balls, etc.; and this phenomenon causes mounting defects. According to the embodiment, the Manhattan phenomenon does not occur easily because the layout of the leadframes is symmetric in the X direction and the solder balls are disposed densely in the X direction.

In the embodiment, the bondability of the wire 15 is good because the leadframe 31 is supported from three directions by the extending portions 31b to 31e. Similarly, the bondability of the wire 16 is good because the leadframe 12 is supported from three directions by the extending portions 12b to 12e.

Such an LED package 2 can be manufactured by a method similar to that of the embodiment described above by modifying the basic pattern of each of the device regions P of the leadframe sheet 23 in the process illustrated in FIG. 10A described above.

In other words, LED packages of various layouts can be manufactured by merely modifying the patterns of the masks 22a and 22b. Otherwise, the configuration, the manufacturing method, and the operational effects of the embodiment are similar to those of the embodiment described above.

In the embodiments described above, the LED chip is not limited to the structure in which two terminals are provided on the upper surface. One terminal may be provided on the lower surface; and the one terminal may be bonded to one of the leadframes by face-down bonding. Alternatively, two terminals may be provided on the lower surface; and the two terminals may be bonded to the first leadframe and the second leadframe respectively by face-down bonding. Multiple LED chips may be mounted to one LED package.

The LED chip is not limited to a chip configured to emit blue light. The phosphor is not limited to a phosphor configured to absorb blue light and emit yellow light. The LED chip may emit visible light of a color other than blue and may emit ultraviolet or infrared. The phosphor may be a phosphor configured to emit blue light, green light, or red light.

The color of the light that the entire LED package emits is not limited to white. Any color tone can be realized by adjusting the weight ratio R:G:B of the red phosphor, the green phosphor, and the blue phosphor such as those described above. For example, a white emitted light having a color from white lamp to white fluorescent lamp can be realized by an R:G:B weight ratio of one selected from 1:1:1 to 7:1:1, 1:1:1 to 1:3:1, and 1:1:1 to 1:1:3. The phosphor may not be provided in the LED package. In such a case, the light emitted from the LED chip is emitted from the LED package.

The multiple LED packages mounted to the light bar are not limited to being connected in series between the anode and the cathode and may be connected in parallel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An illumination apparatus, comprising:
    an LED (Light Emitting Diode) module including a substrate formed in a rectangular plate configuration, an interconnect layer provided on a front surface of the substrate, a reflector film covering the front surface of the substrate, and an LED package mounted on the interconnect layer;
    a light guide plate provided on an LED package mounting surface side of the LED module, the light guide plate being transmissive with respect to light emitted from the LED package; and
    a support body supporting the LED module and the light guide plate, a reflective surface of the support body being provided between a portion supporting the LED module and a portion supporting the light guide plate, the reflective surface being reflective with respect to the light emitted from the LED package,
    the LED module being tilted relative to the reflective surface with the LED package mounting surface being toward the reflective surface, an angle between the LED module and the reflective surface being less than 90°,
    the interconnect layer including a first interconnect layer formed in one continuous pattern extending in a longitudinal direction of the substrate, and a second interconnect layer divided into a plurality in the longitudinal direction of the substrate,
    portions of the interconnect layer being exposed from the reflector film as pads,
    the LED package being mounted on the pads.

2. The apparatus according to claim 1, wherein:
    the substrate includes a first end portion positioned on the support body side and a second end portion positioned on a side opposite to the first end portion with the LED package interposed between the first end portion and the second end portion; and
    a distance between the second end portion and the light guide plate is shorter than a distance between the first end portion and the light guide plate.

3. The apparatus according to claim 2, wherein the LED module further includes a reflector provided at the second end portion, the reflector being reflective with respect to the light emitted from the LED package.

4. The apparatus according to claim 3, wherein a protruding height of the reflector in a thickness direction of the substrate is not less than a protruding height of the LED package in the thickness direction of the substrate.

5. The apparatus according to claim 3, wherein:
    a plurality of the LED packages is arranged in a longitudinal direction of the substrate; and
    the reflector extends in the longitudinal direction of the substrate.

6. The apparatus according to claim 3, wherein the reflector contacts the light guide plate.

7. The apparatus according to claim 2, wherein the LED module further includes a second reflector provided at the first end portion, the second reflector being reflective with respect to the light emitted from the LED package.

8. The apparatus according to claim 7, wherein a protruding height of the second reflector in a thickness direction of the substrate is not less than a protruding height of the LED package in the thickness direction of the substrate.

9. The apparatus according to claim 1, wherein the LED package includes:
    first and second leadframes disposed on a plane;
    an LED chip provided above the first and second leadframes, one terminal of the LED chip being connected to the first leadframe, one other terminal of the LED chip being connected to the second leadframe; and
    a resin body covering the LED chip, the resin body covering an upper surface, a portion of a lower surface and a portion of an end surface of the first leadframe, and an upper surface, a portion of a lower surface and a portion of an end surface of the second leadframe, a remaining portion of the lower surface and a remaining portion of the end surface of the first leadframe being exposed from the resin body, a remaining portion of the lower surface and a remaining portion of the end surface of the second leadframe being exposed from the resin body, and
    one selected from the first leadframe and the second leadframe includes:
    a base portion having an end surface covered with the resin body; and
    a extending portion extending from the base portion, a lower surface of the extending portion being covered with the resin body, a tip surface of the extending portion being exposed from the resin body,
    an exterior form of the resin body being used as an exterior form of the LED package.

10. The apparatus according to claim 9, wherein a protrusion is formed in a region of one selected from the lower surface of the first leadframe and the lower surface of the second leadframe, the region is separated from the other selected from the lower surface of the first leadframe and the lower surface of the second leadframe, a lower surface of the protrusion is exposed at a lower surface of the resin body, and a side surface of the protrusion is covered with the resin body.

11. The apparatus according to claim 9, wherein three of the extending portions extend from the base portion in mutually different directions.

12. The apparatus according to claim 9, wherein the tip surfaces of a plurality of the extending portions are exposed at three mutually different side surfaces of the resin body.

13. The apparatus according to claim 9, wherein the base portion is not exposed at a side surface of the resin body.

14. The apparatus according to claim 1, wherein the interconnect layer includes connector portions of an anode side and a cathode side, the connector portions exposed from the reflector film at a longitudinal-direction end portion of the substrate, the connector portions electrically connectable to an external power source.

15. The apparatus according to claim 1, wherein
    the interconnect layer is made of a metal,
    the substrate is a metal plate,
    the interconnect layer is provided on an insulating layer provided on the metal plate.

16. The apparatus according to claim 1, wherein
    the interconnect layer is made of a metal,
    the interconnect layer is provided on the substrate of a ceramic.

* * * * *